United States Patent [19]

Indo et al.

[11] Patent Number: 5,467,186
[45] Date of Patent: Nov. 14, 1995

[54] ATTRACTING NOZZLE CONTROL APPARATUS FOR A CHIP COMPONENT MOUNTING MACHINE

[75] Inventors: Kenichi Indo; Hitoshi Onodera, both of Iwata, Japan

[73] Assignee: Yamaha Hatsudoki Kabushiki Kaisha, Iwata, Japan

[21] Appl. No.: 148,699

[22] Filed: Nov. 5, 1993

[30] Foreign Application Priority Data

Nov. 9, 1992 [JP] Japan .................................. 4-298730

[51] Int. Cl.⁶ .................................................. G01B 11/00
[52] U.S. Cl. .............................................. 356/150; 356/375
[58] Field of Search .................................. 356/150, 384, 356/385, 386, 387, 375, 400

[56] References Cited

U.S. PATENT DOCUMENTS 5,278,634  1/1994  Skunes .................................. 356/400

FOREIGN PATENT DOCUMENTS 0471272  2/1992  European Pat. Off. .
2183820  6/1987  United Kingdom ................... 356/375
9214988  9/1992  WIPO .

*Primary Examiner*—Richard A. Rosenberger
*Attorney, Agent, or Firm*—Knobbe, Martens, Olson & Bear

[57] ABSTRACT

An apparatus for optically detecting the offset of the pick up of a component having an irregular shape relative to a pick-up device so as to calculate the amount of offset for accurately positioning the component. The system uses an optical measuring system that is capable of making the calculations from certain forms of regular shapes. The component has different sections with different shapes one of which is regular and the apparatus is constructed so as to insure that the proper area of the component will be measured.

9 Claims, 7 Drawing Sheets

ATTRACTING NOZZLE CONTROL APPARATUS FOR A CHIP COMPONENT MOUNTING MACHINE

BACKGROUND OF THE INVENTION

This invention relates to an attracting nozzle control apparatus for a chip component mounting machine and, more particularly, to an improved apparatus and method for mounting components on a substrate.

A wide variety of types of apparatus have been proposed for picking up small components such as integrated circuits, resistors or the like, and mounting these components at an accurate location on a substrate. The components are normally picked up by a pick up device such as a vacuum pick up nozzle from a feeder station. When the components are picked up, their orientation relative to the pick up device cannot be accurately Controlled so as to ensure precision mounting. Therefore, it has been proposed to provide various ways in which the orientation of the component, as picked up by the pick up device, is determined, and then the mounting position is corrected to accommodate errors in the pick up location.

The co-pending application of Hiroshi Sakurai et al., entitled "Method For Mounting Components And An Apparatus Therefor," Ser. No. 08/073,741, filed Jun. 8, 1993, and assigned to the assignee hereof, discloses a method whereby optically it is possible to determine the orientation of a component picked up by the pick up device by rotating the component and measuring the projected length of the component in two (2) angular positions. From these measurements, the actual location of pick up can accurately be determined and the corrective factors calculated.

The apparatus and method shown in the aforenoted co-pending application Ser. No. 073,741 is particularly adapted when the component has a rectangular or square configuration. However, many components do not have such a configuration along their total height and this can give rise to certain problems in making the calculations and measurements necessary to determine the orientation. This may be best understood by reference to FIGS. 1 through 4, where FIG. 1 shows a type of component that can be easily measured with this type of apparatus, and FIGS. 2 through 4 show another type of component which could be measured by this apparatus if the component is correctly positioned in the sensing station.

Referring first to FIG. 1, a pick up and detecting station is identified generally by the reference numeral 11 and includes a pick up nozzle 12 that is adapted to pick up by means of a vacuum force, a small component, indicated generally by the reference numeral 13 which may be such an item as an integrated circuit, resistor, capacitor or the like. As will become apparent, the pick up nozzle 12 is movable in a vertical Z—Z axis and is rotatable about a vertically extending rotational R-axis.

The component 13 is picked up from a delivery station and then is raised into proximity with a sensing device, indicated generally by the reference numeral 14 which is comprised of a laser 15 that emits a plurality of parallel light rays L across a gap between the laser 15 and a detector 16 in the form of a capacitor coupled device (C.C.D.) that will receive a shadow from the component 13. The component 13 is then rotated by rotation of the nozzle 12 in a manner as described in the aforenoted co-pending application, Ser. No. 073,741, the disclosure of which is incorporated herein by reference. As noted in that application, this type of detecting apparatus 11 is particularly adapted for recognizing components having rectangular configurations in this method.

Although this type of device is very effective, its effectiveness is limited to the shape of the component which is picked up. Certain problems can be presented when the component picked up has, in addition to rectangular sections, other sections which are not rectangular, such as the component identified by the reference numeral 17 in FIGS. 2 through 4.

The component, indicated generally by the reference numeral 17, has a lower rectangular portion 18 which will actually be the portion that is mounted on the substrate (printed circuit board or the like). Extending upwardly from the rectangular section 18, is a cylindrical section 19 which may comprise a capacitor, resistor or other device having such a configuration. If the pick up nozzle 12 picks up the component 17 and positions it in the detecting apparatus 11 in an orientation as shown in FIG. 3 wherein the light rays L from the laser source intersect the rectangular section 18 rather than the cylindrical section 19, the device will be able to read the component 17 and develop the appropriate correction factors. If, however, the device 17 is picked up and is positioned in the detector section 11 as shown in FIG. 4, then a different situation will prevail.

It should be noted that with a conventional type of construction, the pick up nozzle 13 is moved to a fixed height in the detector section 14 and as may be seen from a comparison of FIGS. 1 and 4, the height of the nozzle 13 in FIG. 4 is the same as the height in FIG. 1 as would be the case with the conventional type of apparatus. When this occurs, the light rays L will strike the cylindrical section 19 of the component 17 rather than its rectangular portion and, accordingly, the device will be incapable of reading a correction factor because as the unit 19 is rotated, the area shadowed will remain of a constant width, although this shadow may shift slightly due to eccentric pick up.

It is, therefore, a principle object of this invention to provide an improved attracting nozzle control apparatus for a component mounting machine, and more particularly to an apparatus which can pick up components of irregular shapes or having portions of their shapes such that they cannot be read by the detector section and still providing an accurate detection signal.

It is a further object of this invention to provide an improved detecting apparatus and method for a component mounter using an optical scanner system that will ensure that the section of the component scanned is that which can be easily and correctly read.

SUMMARY OF THE INVENTION

The invention is adapted to be embodied in a component measuring system for measuring a component by rotating it in an optical detector station. A pick up device is supported for movement in a first direction and is rotatable about an R-axis parallel to that direction. The optical detector station has an optical range limited in the first direction and which is defined by means for creating a plurality of parallel light rays. The pick up device is moveable in the first direction to a position wherein a component held thereby is moved into the optical range.

Means limit the movement in the first direction so that a desired area of the component will be in the optical range.

DETAILED DESCRIPTION OF THE PREFERRED EMBODIMENT OF THE INVENTION

Figure 5:
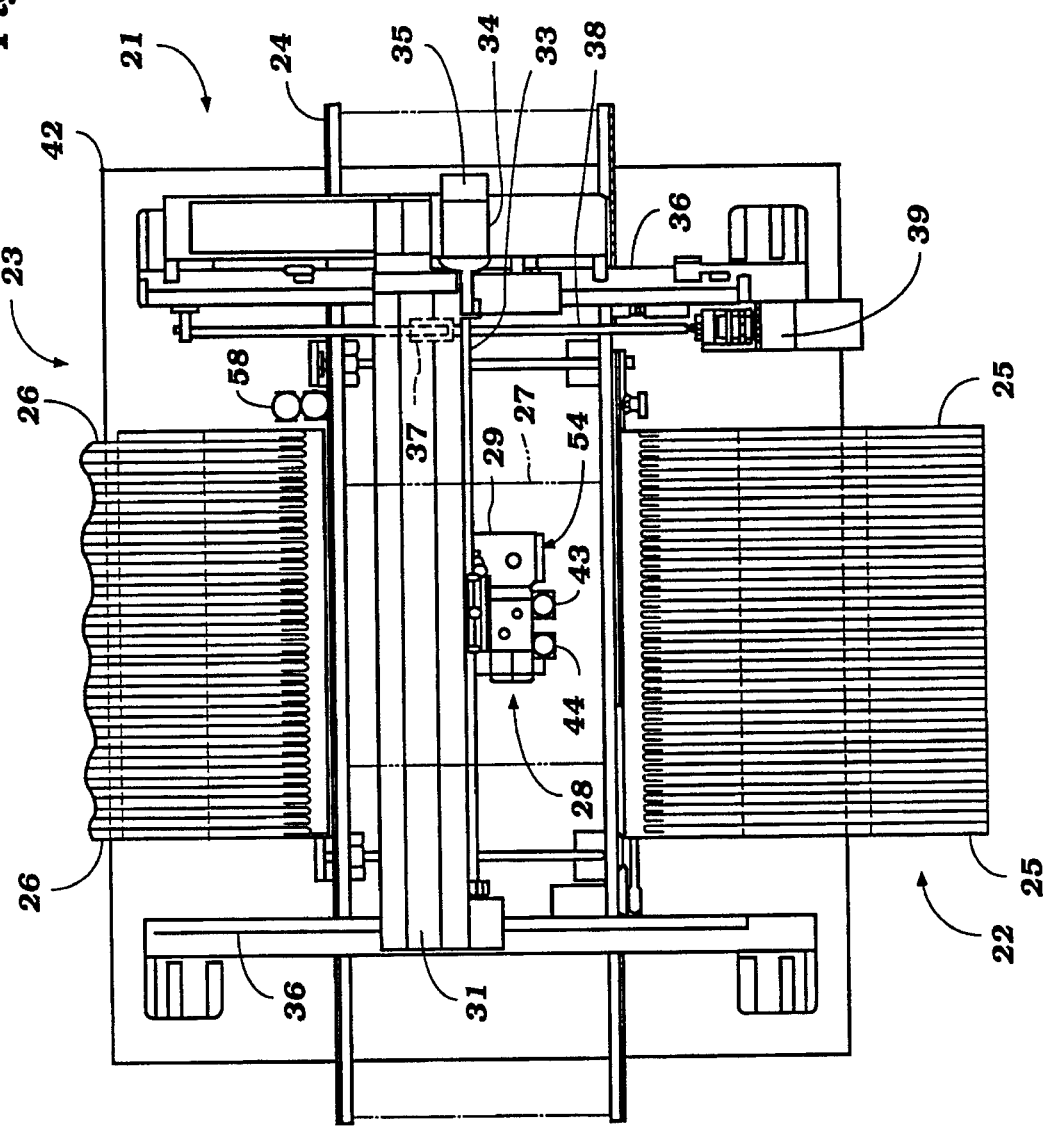
FIG. 5 is a top plan view of a component mounting apparatus constructed in accordance with an embodiment of the invention.
Figure 6:
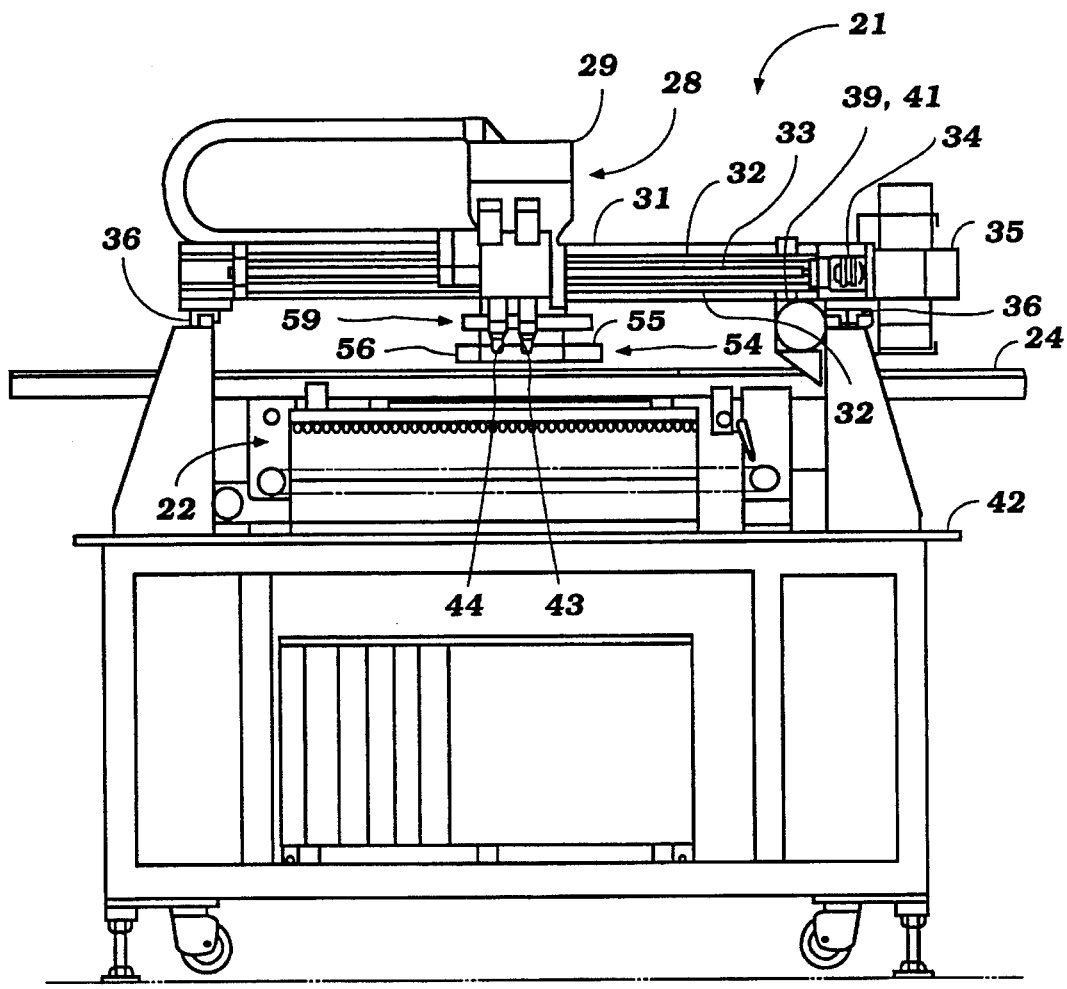
FIG. 6 is a front elevational view of the component mounting apparatus.

Referring now in detail to the drawings and initially to FIGS. 5 and 6, a component mounting apparatus constructed and operated in accordance with a preferred embodiment of the invention is identified generally by the reference numeral 21. The apparatus 21 is adapted to mount small components such as integrated circuits, resistors, capacitors or the like which are supplied at respective delivery stations 22 and 23 disposed on opposite sides of a conveyor assembly 24. The delivery sections 22 and 23 comprise a plurality of individual feeders 25 and 26, respectively, of the type each of which comprises a roll of tape having pockets in which the components to be mounted are contained. These tapes are advanced by a ratchet mechanism under a control as is well known.

The conveyor 24 selectively presents substrates, indicated at 27, to a mounting area positioned between the delivery sections 22 and 23. A pick-up and recognition device, indicated generally by the reference numeral 28 is mounted for movement in an X—X and Y—Y direction in a manner which will be described so as to selectively pick up components from the feeders 25 and 26 and position them on the substrates 27 at the desired and preprogrammed location. In addition, the pick-up and recognition station 28 cooperates so as to provide an indication of the orientation of the components picked up thereby so as to adjust for their mounting position, as will be described.

The pick-up and recognition station 28 includes a mounting head 29 which is mounted for movement along a carriage 31 by means of guide rails 32 and a driving feed screw 33. The feed screw 33 has a ball nut connection with the mounting head 29 so that upon rotation of the feed screw 33, the mounting head 29 will move in the X—X axis.

An X—X axis drive motor 34 is mounted at one end of the carriage 31 and is coupled to the feed screw 33 for driving it in clockwise or counter-clockwise directions so as to appropriate position the mounting head 29. An encoder 35 is coupled to the electric motor 34 and provides a positional X—X signal to the control apparatus as shown in the block diagram of FIG. 8.

The carriage 31 is mounted for movement in the Y—Y direction on a pair of guide rails 36 which are disposed at opposite sides of the area where the substrates or printed circuit boards 27 are disposed and outwardly of the ends of the feeder sections 22 and 23. A suitable way construction permits this movements along the guide rails 36.

Figure 8:
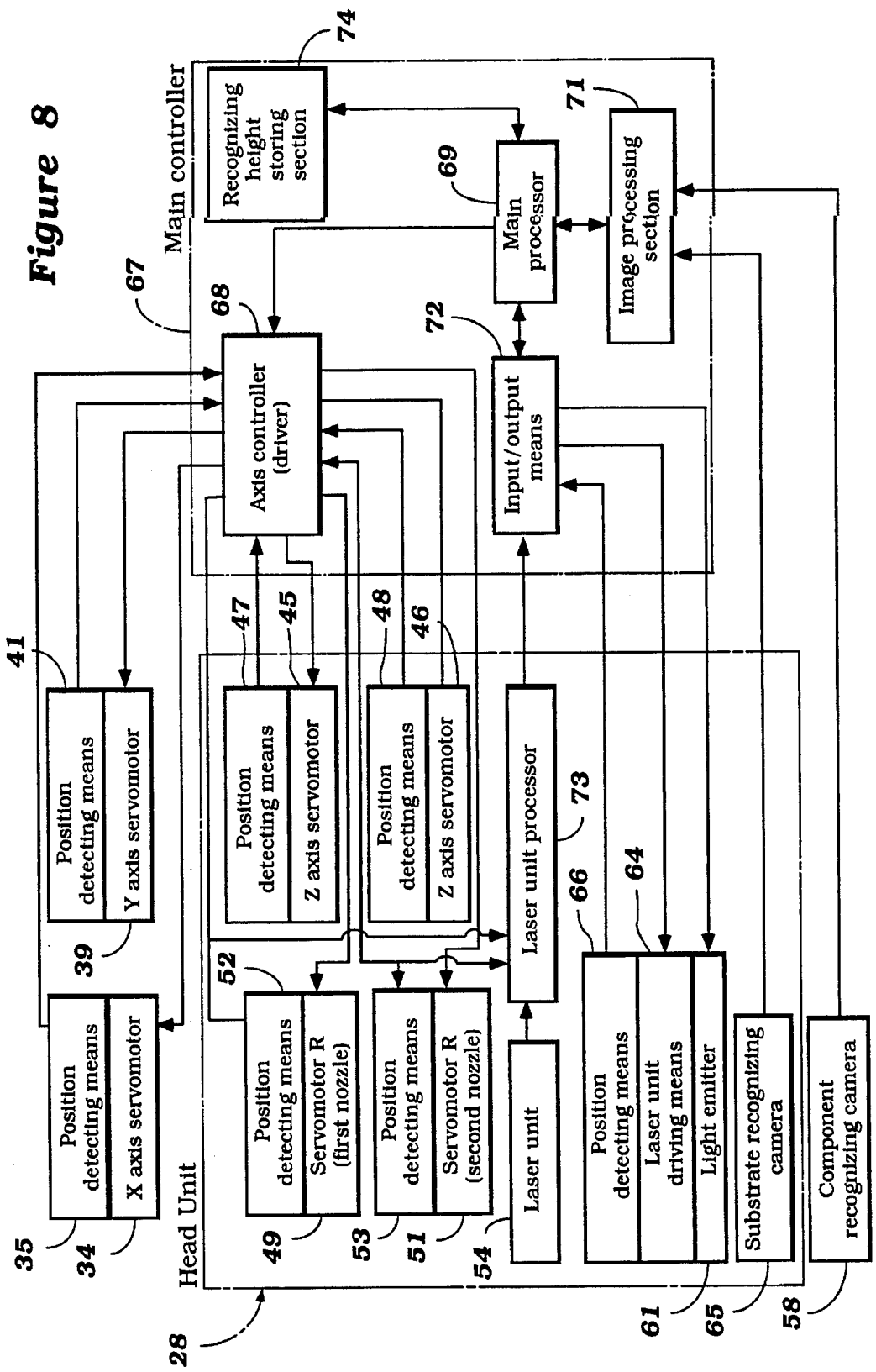
FIG. 8 is a block diagram showing the interrelationship between the various components.

The carriage 31 is provided with a recirculating ball nut 37 which is engaged with a feed screw 38 that is journalled on one of the guide rails 36. This feed screw 38 is driven by a reversible electric motor 39 so as to move the carriage 31 and mounting head assembly 28 in the Y—Y direction. An encoder 41 is coupled to the motor 39 and as shown in FIG. 8, provides an output signal indicative of the Y—Y position of the mounting head assembly 28.

The entire assembly as thus far described may be mounted conveniently on a table 42 so that the apparatus can be moved from location to location, but also can be retained in position.

Figure 7:
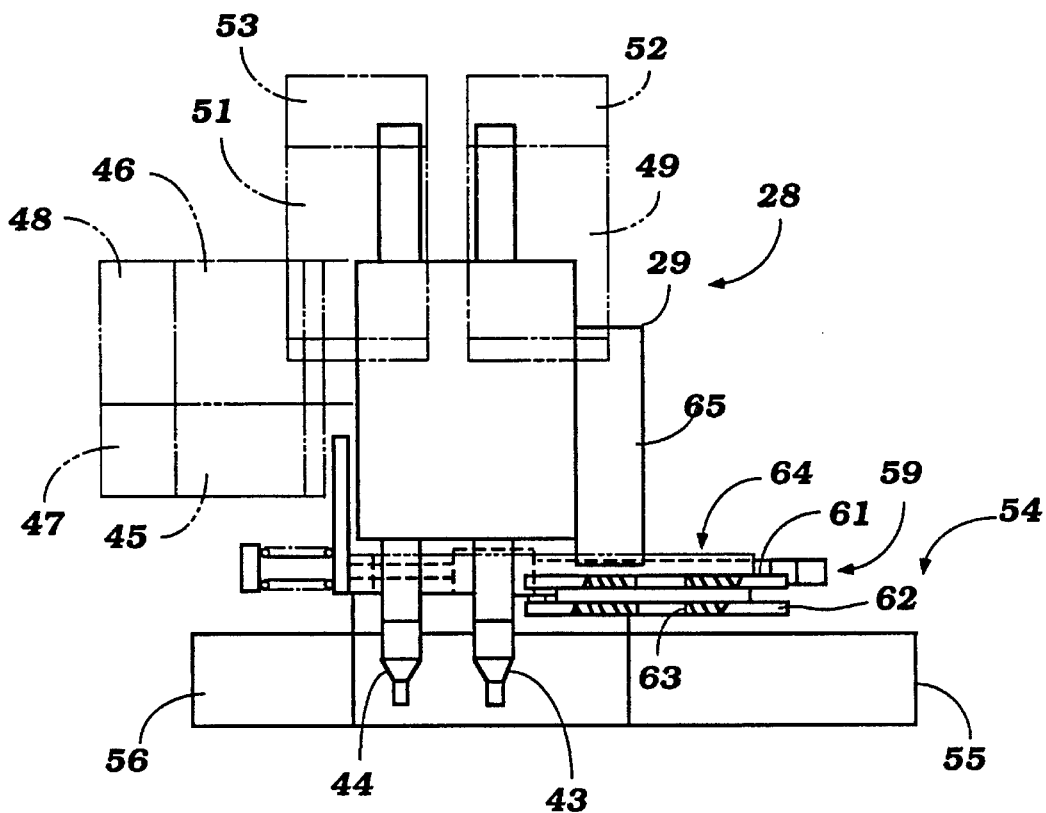
FIG. 7 is an enlarged front elevational view showing the detecting station and is in part similar to FIGS. 1, 3, and 4.

The construction of the gripping and detecting section 28 will now be made by reference to FIG. 7. Referring to FIG. 7, it should be noted that the mounting head 29 carries, in this embodiment, two pick-up nozzles indicated by the reference numerals 43 and 44. The pick-up nozzles 43 and 44 are of the vacuum type, but it should be readily apparent to those skilled in the art how the invention can be employed with other types of pick-up nozzles. Reference is made to the co-pending application filed in the name of Hiroshi Sakurai et al. entitled "Method For Mounting Components And An Apparatus Therefor", Ser. No. 08/086,512, filed Jul. 1, 1993, and assigned to the Assignee hereof for a more detailed description of how the plural pick-up nozzles may be mounted on a single mounting head. The disclosure of that application is incorporated herein by reference.

Briefly summarized, each of the pick-up nozzles 43 and 44 is mounted for movement in a vertical direction along a Z—Z plane by the mounting head 29 and is driven for movement in such direction by a respective Z—Z axis servo motor 45 or 46. Encoders 47 and 48 are coupled to the drive motors 45 and 46 so as to provide an output signal indicative of the Z—Z position of the respective nozzles 43 and 44 as shown in FIG. 8.

In addition, the nozzles 43 and 44 are also supported for rotation about vertical R axes in a manner described in the aforenoted co-pending application Ser. No. 08/086,512. Rotational movement about these axes is obtained by R axis servo motors 49 and 51 which are coupled to the nozzles 43 and 44, respectively, for effecting rotary movement. Encoders 52 and 53 are connected to the motors 49 and 51, respectively, and provide output signals indicative of the angular position about the rotation R axes. Again, the relationship of these components is shown in FIG. 8.

The station 28 also serves for providing detection of the position of the components which are picked up by the pick-up nozzles 43 and 44 so as to make correction factors for misalignment of their pick up from the ideal position so that when they are positioned on the substrate 27 they will be positioned in an accurate location.

In accordance with a procedure as set forth in the co-pending application of one of the inventors hereof, Hitoshi Onodera, entitled Component Attracted State Detecting System for Component Mounting Machine, Ser. No. 08/148,832, filed Nov. 5, 1993; which application is assigned to the assignee hereof, two different forms of detectors are employed depending upon the type of article which will be picked up by the nozzles 43 and 44. If the article to be picked up has a generally regular rectangular configuration or a section of such configuration, such as many chips and other components, then the orientation will be detected by a detector, indicated generally by the reference numeral 54, which is described as being of the optical type. This is the type of detector which is described in detail in aforenoted co-pending application Ser. Nos. 73,741, and 86,512, the disclosures which have already been incorporated herein by reference.

Briefly, this detector 54 includes a laser light source 55 that emits generally straight light rays across a gap 56 in which the pick-up nozzles 43 and 44 may be positioned, as will be described, and cast shadows on a receptor 57 of the capacitor coupled type (C.C.D.) type. In order to permit simultaneous recognition and measurement of components carried by both of the pick-up nozzles 43 and 44 at the same time, these nozzles are staggered relative to the gap 56 as best seen in FIGS. 6 and 7 and this method of simultaneous measurement is as described in any of the routines of application Ser. No. 86,512.

In addition to the optical detecting method described in the aforenoted co-pending applications Ser. Nos. 73,741 and 86,512, at least one of the pick-up nozzles 43 and 44 and in this case the pick-up nozzle 43, is adapted to present components to a further type of detector, a photographic detector, indicated at the reference numeral 58 in FIG. 5 and which is positioned at one side of the conveyor 24. When this detector 58 is employed, the head assembly 28 is moved into registry with it so that the component carried by the nozzle 43 can be read in a manner as set forth in co-pending application Ser. No. 08/148,832.

To facilitate this reading, there is provided an optical assist device, indicated generally by the reference numeral 59 which is mounted on the head 29 in a manner for movement in a direction parallel to the upper surface of the optical detector 54. This optical assist device 59 is comprised of a light source 61 of a suitable type such as an array of light emitting diodes and a lower diffuser section 62 which also forms a background for photography which will transmit and diffuse the light. The diffuser section 62 may be comprised of a milk white acrylic plate or the like so that light from the emitter 61 will be diffused. The light source 61 and diffuser plate 62 are provided with an aperture 63 which, when brought in registry with the nozzle 43, will act as a background for photographing of a component carried by this nozzle 43 by the photographic detection section 58 for recognition and orientation calculation purposes.

As has been noted, the photo assist section 59 is supported for transverse movement and this transverse movement is accomplished by means of a driving mechanism, indicated generally by the reference numeral 64 which is operatively connected to the photo assist device 59 in the manner as described in aforenoted co-pending application, Ser. No. 08/148,832, the disclosure of which is incorporated herein by reference. Briefly stated, this mechanism is capable of moving the photo assist device 59 between three (3) positions, a neutral or retracted position as shown in FIG. 7, a first operative position shifted fully to the left as shown in FIG. 7 so that the aperture 63 is in line with the nozzle 43 so that the nozzle 43 can extend through the aperture 63 for photographic recognition of a component carried thereby by the camera 58 in a manner as described in that co-pending application and a third position wherein the aperture 63 becomes aligned with a substrate camera 65 also carried by the head 29. This camera 65 is adapted to photograph a substrate 27 or specifically a specific area thereon wherein a recognition portion is supplied as described in the aforenoted co-pending application.

Since this invention deals only with the way in which the optical sensing device 54 operates in conjunction with the components carried by the pick up nozzles 43 and/or 44, further description of the photographic recognition techniques is not necessary to understand the construction and operation of this portion of the construction. For the purposes of the block diagram of FIG. 8, however, it should be noted that the apparatus and specifically the mounting head assembly 28 is provided with a position detector, shown schematically at 66 which provides a signal indicative of the position of the photo assist device 59. The interrelationship of the components will now be described by reference particularly to that Figure.

Figure 9:
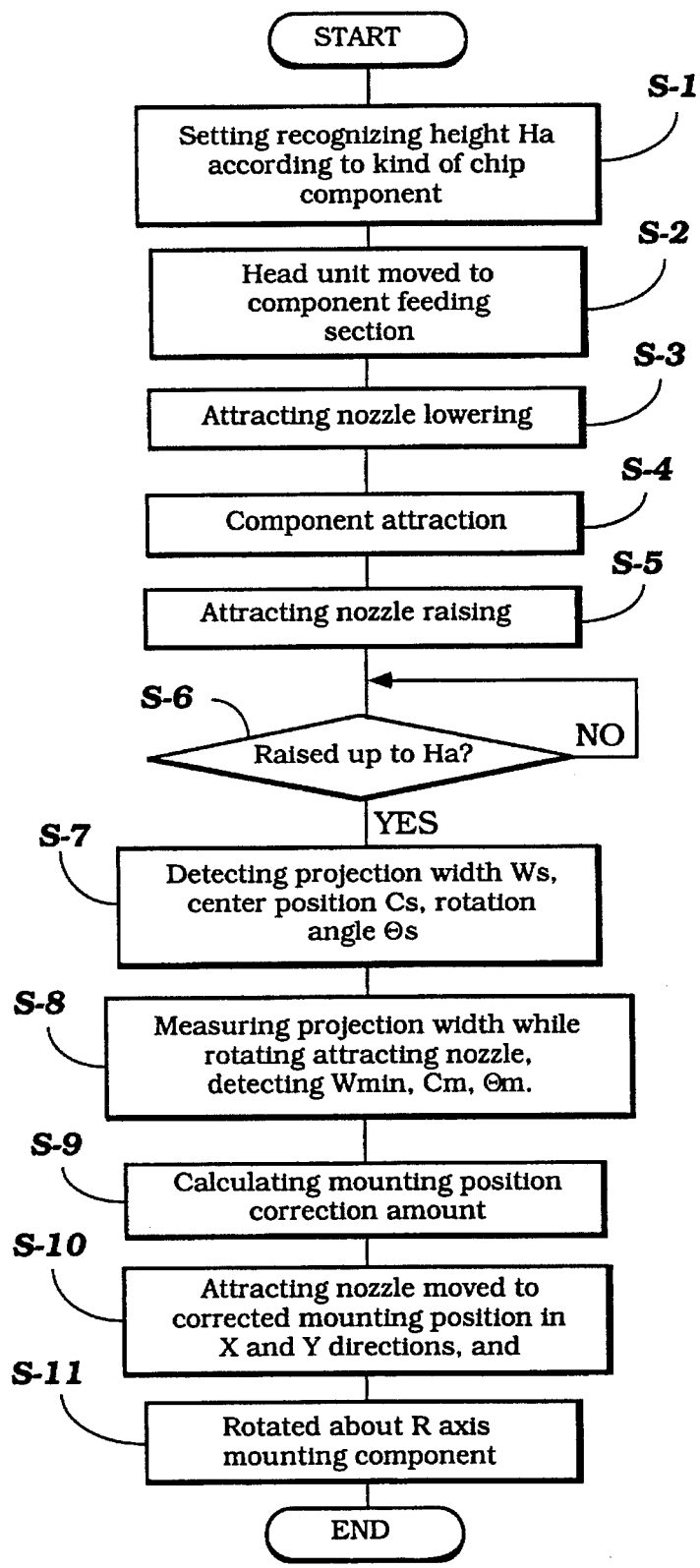
FIG. 9 is a block diagram showing the control routine in accordance with a preferred embodiment of the invention.

The unit as shown schematically in FIG. 9 includes all of the components as thus far described and their interrelationship is shown schematically for control purposes in this Figure. The unit also includes a main controller 67 which has an axis controller drive unit 68 which controls the operation of the X-axis servo motor 34, the Y-axis servo motor 39, the Z-axis servo motors 45 and 46, and the R-axis servo motors 49 and 51 associated with the first and second pick up nozzles 43 and 44, respectively. This axis driver controller circuit 68 also receives back signals from the various encoders or position detectors 35, 36, 47, 48, 49 and 51 associated with the aforenoted servo motors.

The axis controller driver circuit 68 receives its signals from a main processor 69 so as to affect the movement in accordance with the procedures which will described herein and also the procedures described in each of the three (3) co-pending applications which deal primarily with the movement for pick up and mounting and the specific recognition techniques employed therein.

Both the substrate recognizing camera 65 and the component recognizing camera 58 output their signals to an image processing section 71 which includes a map or memories of certain information as also described in the aforenoted co-pending applications.

The main controller further includes an input output circuit or means that receives a signal from a laser processor unit 73 which is coupled to the laser unit 54 so as to receive signals from it and also to receive signals from the R-axis position detectors 51 and 52 which are employed in determining the correction factors for the rectangular or regular section components as described in co-pending application, Ser. No. 73,741. This method will be described only briefly in connection with this application since the disclosure of the detailed method appears in that co-pending application which is incorporated herein by reference.

Figure 2:
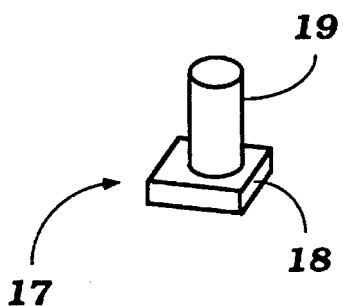
FIG. 2 is a prospective view of another type of component which cannot be handled appropriately in the normal detecting device.
Figure 3:
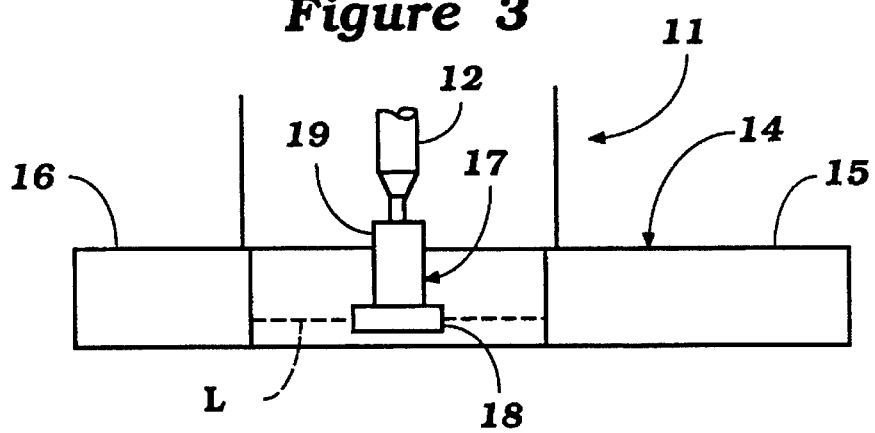
FIG. 3 is an enlarged side elevational view, in part similar to FIG. 1, showing how the component should be positioned in the detecting device for proper reading.
Figure 4:
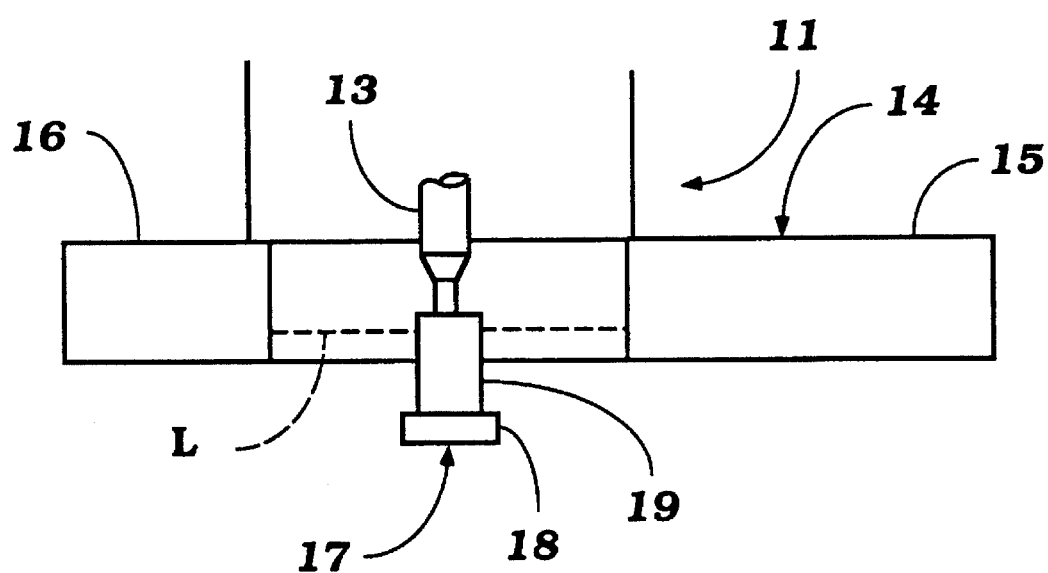
FIG. 4 is an enlarged slide elevational view, in part similar to FIGS. 1 and 3, and shows how a conventional apparatus would position the component of FIG. 2 in the detecting station.

In addition, there is provided an additional unit, indicated by the reference numeral 74 which is comprised of a recognized height storing section which is connected to the main controller 69 and which received signals from the image processing unit 71 which will indicate to it the type of component being picked up. If the component is of a type as previously mentioned and as shown in detail in FIG. 2, then the height storing section 74 has in its memories the appropriate Z-axis position for the respective pick up either 43 or 44 so that the rectangular section of the component 18 as indicated in FIGS. 2 through 4 is positioned in the location as shown in FIG. 3 where the light emitted from the photo recognition section will strike this portion of the picked up component.

Figure 1:
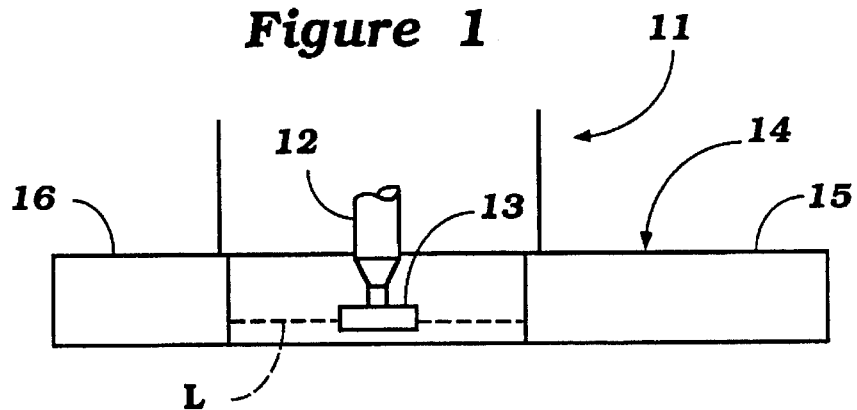
FIG. 1 is an enlarged side elevational view of a detecting device showing the handling of a normal type of component.

As to all other types of components, they will be elevated to a preset height for the pick up nozzles 43 and 44 as shown in FIG. 1 wherein the recognition can be easily accomplished at this position.

The sequence of operation will now be described in conjunction with FIG. 9 and it is to be understood that this Figure only depicts the sequence of operation so as to provide the corrective factor with an article of the type shown in FIG. 2 which has to be elevated at a predetermined height in the detector section 54 so as provide an accurate indication of the offset of its pick up so that X, Y and R axis correction factors can be made in the final mounting position for the respective nozzle. It is to be understood that the device also will probably only pick up one component when this irregular shape is present because such components tend to be larger than the normal type of component having a rectangular configuration. However, as described in co-pending application Ser. No. 86,512, the device may operate under a number of different types of programs so as to read both components simultaneously or one component at a time or only a single component picked up only by a single pick-up nozzle.

Referring now to FIG. 9, the program starts and then moves to the step S-1 so as to set the recognizing Ha in accordance with the kind of chip component. As has been described, this will depend on the shape of the components and whether they are regular components as shown at 13 in FIG. 1 or irregular components as shown at 17 in FIGS. 2 through 4. This determination is made in the main program of the main controller 67 before the component is in fact selected.

The program then moves to the step S-2 so that the head 28 will be moved to the appropriate pick up or feeder station 25 or 26 to pick up the desired component.

Once the head 28 is at the desired station, then the attracting nozzle 43 and/or 44 is lowered at the step S-3 by driving its respective Z axis servo motor 45 and/or 46. Once the pick-up nozzle 43 or 44 is lowered to the appropriate height or during the lowering process, vacuum is exerted and when the nozzle is adjacent the component it will be attracted at the step S-4.

After this occurs, the attraction nozzle is raised at the step S-5 and this raising operation is as described in the aforenoted co-pending applications which may also incorporate initial rotation of the respective pick-up nozzle 43 and/or 44, if this type of sequence of operation is employed as described in aforenoted co-pending application Ser. No. 86,512.

At the step S-6 it is determined if the respective attracting nozzle has been raised to the pre-set height Ha programmed in the recognized height storing section 74 of the main controller. If the height has not been reached, the program repeats.

If, however, the component picked up by the respective pickup nozzle 43 and/or 44 is at the height Ha, then the detecting operation is accomplished by the method as set forth in co-pending applications Ser. No. 73,741 wherein the projected width $W_s$ of the shadow of the portion 18 of the component 17 (FIGS. 2 through 4) on the detector C.C.D. 56 (FIG. 7) is measured as well as the initial angle of the component $\theta_s$ and its center position $C_s$. This is done at the step S-7. Then, at the step S-8 the component is rotated by operating the respective R axis servo motor and the measurements are continued to be made so as to determine $W_{min}$ (the minimum width), $C_m$ and $\Theta_m$ at this position. As described in the aforenoted application, then a corrective position amount $X_{cor}$, $Y_{cor}$ and $R_{cor}$ can be made at the step S-9.

The main processor 69 then operates the axis driver 68 to move the mounting head 28 in the respective X and Y directions and the step S-10 so to arrive at the corrected final positions using the previously noted corrections factors so as to appropriately positioned the component on the substrate 27. At the same time, rotation occurs about the R axis at the step S-11 so as to adjust $\theta_{cor}$ so that the component 17 will be at the exact angular location for mounting. The program then ends.

From this description, it should be readily apparent that the described apparatus is extremely effective in being able to optically recognize components which do not have a completely recognizable configuration, but which do have rectangular portion which can be utilized for this type of correction calculation. This is done by placing the component in the optical detector 54 at such a location so that the light rays from the emitter or light source 55 will pass across this section of the component. Of course, the foregoing description is that of a preferred embodiment of the invention and various changes and modifications may be made without departing from the spirit and scope of the invention, as defined by the appended claims.

We claim:

1. A component measuring system for measuring a component by rotation in an optical detecting station comprising a pick-up device supported for movement in a first direction and rotatable about an axis parallel to the first direction, an optical detection station having an optical range in the first direction that is limited in dimension and which is less than the degree of movement of said pick-up device in said first direction and defined by means for creating a plurality of parallel light rays, means for moving said pick-up device in selected amounts in said first direction into a position wherein a selected portion of the component held thereby is moved into said optical range, and means for controlling the movement in said first direction so that said selected portion of the component will be within the optical range.

2. A component measuring system for measuring component by rotation in an optical detecting station as set forth in claim 1 wherein the component had a first area within the first direction having a first configuration and a second area in the first direction of a second configuration and wherein the distance between the pick-up device and the first and second areas are different and the means for controlling the movement limits the movement so that the first area is disposed in the range of the parallel light rays.

3. A component measuring system for measuring a component by rotation in an optical detecting station as set forth in claim 1 wherein the pick-up device is supported for movement in directions normal to the first direction so as to pick the component up at a first location and to deposit it at a second location.

4. A component measuring system for measuring a component by rotation in an optical detecting station as set forth in claim 3 wherein the optical detector station further includes a receptor for receiving light rays from the means for creating the parallel light rays so as to provide a shadow indicative of the projected length of the component in the plane of the detector.

5. A component measuring system for measuring a component by rotation in an optical detecting station as set forth in claim 4 wherein the first area of the component is rotated between two angular positions for computing the corrective factors indicative of the offset of the component relative to the pick-up device in the X, Y and rotational R axes.

6. A component measuring system for measuring a component by rotation in an optical detecting station as set forth in claim 3 wherein the component had a first area within the first direction having a first configuration and a second area within the first direction of a second configuration and wherein the distance between the pick-up device and the first and second areas are different and the means for controlling the movement limits the movement so that the first area is disposed in the range of the parallel light rays.

7. A component measuring system for measuring a component by rotation in an optical detecting station as set forth in claim 6 wherein the optical detector station further includes a receptor for receiving light rays from the means for creating the parallel light rays so as to provide a shadow indicative of the projected length of the component in the plane of the detector.

8. A component measuring system for measuring a component by rotation in an optical detecting station as set forth in claim 7 wherein the first area of the component is rotated between two angular positions for computing the corrective factors indicative of the offset of the component from the pick-up device in the X, Y and rotational R axes.

9. A component measuring method for measuring a component by rotation in an optical detecting section, said component having a first area having a first configuration and a second area adjacent said first area and having a second configuration, a pick-up device adapted to pick up components and move them in a first direction and rotate them about an axis parallel to the first direction, an optical detection section having an optical range in the first direction that is limited in dimension and which is less than the degree of movement of said pick-up device in said first direction, said optical detecting section including at least means for creating a plurality of parallel light rays, said method comprising the steps of picking up a component and by said pick-up device and moving it in said first direction from a pick-up position to a position contiguous to the said optical detection section, determining which area of the picked up component is to be sensed in the optical detecting section, and moving said pick-up device in said first direction so as to position the selected area in said optical range, and rotating said component when within said optical range.

* * * * *

UNITED STATES PATENT AND TRADEMARK OFFICE
CERTIFICATE OF CORRECTION

Page 1 of 2

PATENT NO. : 5,467,186
DATED : November 14, 1995
INVENTOR(S) : Kenichi Indo & Hitoshi Onodera It is certified that error appears in the above-indentified patent and that said Letters Patent is hereby corrected as shown below:

Column 8/Line 22, Claim 1, after "measuring", (2nd occ.) insert --the orientation of--.
Line 23, after "rotation", insert --between first and second angular positions--;
Line 23, after "station", insert --, the component having first and second portions spaced relative to each other in the first direction, one of said portions having a configuration that will not permit measurement of its orientation in the first and second angular positions and the other of said portions having a configuration that will permit measuring of its orientation by rotation between the first and second angular positions, said system --;
Line 30, after "rays," insert --means for sensing from the component which of the first and second portions will permit the orientation of the component to be determined by rotation between the first and second positions for selecting a selected portion,--.

Column 8/Lines 38-40, Claim 2, delete --the component had a first area within the first direction having a first configuration and a second area in the first direction of a second configuration and wherein-- ;
Line 42, "areas" should be --portions--;
Line 43, "area" should be --portion--.

Column 8/Line 60, Claim 5, "area" should be --portion--.

Column 8/Line 66-67, Claim 6 & Column 9/Lines 1-2, Claim 6, delete --the component had a first area within the first direction having a first configuration and a second area within the first direction of a second configuration and wherein--;

Column 9/Line 3, Claim 6, "areas" should be --portions--;
Line 4, "area" should be --portion--.

Column 9/Line 15, Claim 8, "area" should be --portion--.

UNITED STATES PATENT AND TRADEMARK OFFICE
CERTIFICATE OF CORRECTION

PATENT NO. : 5,467,186

DATED : November 4, 1995

INVENTOR(S) : Kenichi Indo, et al.

It is certified that error appears in the above-indentified patent and that said Letters Patent is hereby corrected as shown below:

Column 10/Line 1, Claim 9, "area" should be --portion--;
Line 2, "area" (in both instances) should be --portion--;

Signed and Sealed this

Third Day of December, 1996

Attest:

BRUCE LEHMAN

Attesting Officer       Commissioner of Patents and Trademarks

UNITED STATES PATENT AND TRADEMARK OFFICE
Certificate

Patent No. 5,467,186                                                 Patented: November 14, 1995

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Kenichi Indo, Iwata-Shi, Japan; Hitoshi Onodera, Iwata-Shi, Japan; Stephen K. Case, Minneapolis, MN.

Signed and Sealed this Eighteenth Day of April, 2000.

FRANK G. FONT,
*SPE 2877*
Examining Group 2870